United States Patent
Noorbakhsh et al.

(10) Patent No.: US 10,886,107 B2
(45) Date of Patent: *Jan. 5, 2021

(54) EXTENDED DETACHABLE GAS DISTRIBUTION PLATE AND SHOWERHEAD INCORPORATING SAME

(71) Applicant: APPLIED MATERIALS, INC., Santa Clara, CA (US)

(72) Inventors: Hamid Noorbakhsh, Fremont, CA (US); Xiaoping Zhou, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/460,987

(22) Filed: Jul. 2, 2019

(65) Prior Publication Data

US 2019/0326100 A1    Oct. 24, 2019

Related U.S. Application Data

(63) Continuation of application No. 15/416,757, filed on Jan. 26, 2017, now Pat. No. 10,373,810.

(Continued)

(51) Int. Cl.
*H01J 37/32* (2006.01)
*C23C 16/455* (2006.01)
(Continued)

(52) U.S. Cl.
CPC ........ *H01J 37/32449* (2013.01); *B05B 1/005* (2013.01); *B05B 1/18* (2013.01);
(Continued)

(58) Field of Classification Search
CPC ........... H01J 37/32449; H01J 37/32568; H01J 37/3244; H01J 37/32541; H01J 37/32082; B05B 1/18; B05B 1/005; C23C 14/24; C23C 14/243; C23C 14/56; C23C 14/562; C23C 14/568; C23C 16/4485; C23C 16/45548; C23C 16/45551; C23C 16/54; C23C 16/545; C23C 16/448; C23C 16/452; C23C 16/453; C23C 16/455;
(Continued)

(56) References Cited

U.S. PATENT DOCUMENTS 6,170,432 B1 * 1/2001 Szapucki .............. C23C 16/455
                                                        118/723 E
7,743,730 B2   6/2010 Kholodenko et al.
(Continued)

*Primary Examiner* — Rudy Zervigon
(74) *Attorney, Agent, or Firm* — Moser Taboada

(57) ABSTRACT

Embodiments of showerheads having a detachable gas distribution plate are provided herein. In some embodiments, a showerhead for use in a semiconductor processing chamber may include a body having a first side and a second side; a gas distribution plate disposed proximate the second side of the body and having an annular channel formed in a side surface; and a clamp disposed about a peripheral edge of the gas distribution plate to removably couple the gas distribution plate to the body, wherein the clamp includes a body and a protrusion extending radially inward into the annular groove, and wherein a portion of the gas distribution plate extends over a bottom surface of the clamp.

19 Claims, 3 Drawing Sheets

Related U.S. Application Data

(60) Provisional application No. 62/297,930, filed on Feb. 21, 2016.

(51) Int. Cl.
*B05B 1/18* (2006.01)
*B05B 1/00* (2006.01)

(52) U.S. Cl.
CPC .... *H01J 37/3244* (2013.01); *H01J 37/32082* (2013.01); *H01J 37/32541* (2013.01); *H01J 37/32568* (2013.01)

(58) Field of Classification Search
CPC ....... C23C 16/458; C23C 16/46; C23C 16/48; C23C 16/50; C23C 16/503; C23C 16/505; C23C 16/507; C23C 16/509; C23C 16/511; C23C 16/513; C23C 16/515; C23C 16/517; C23C 16/52
USPC .................. 118/715; 156/345.33, 345.34
See application file for complete search history.

(56) References Cited

U.S. PATENT DOCUMENTS

| | | |
|---|---|---|
| 8,235,001 B2 | 8/2012 | Sano et al. |
| 9,111,968 B2 | 8/2015 | Kholodenko et al. |
| 9,484,190 B2 * | 11/2016 | Glukhoy ............. H01J 37/3244 |
| 9,610,591 B2 | 4/2017 | Lubomirsky et al. |
| 9,911,579 B2 | 3/2018 | Della Rosa et al. |
| 10,373,810 B2 * | 8/2019 | Noorbakhsh ............. B05B 1/18 |
| 2002/0127853 A1 | 9/2002 | Hubacek et al. |
| 2004/0129211 A1 * | 7/2004 | Blonigan ............... C23C 16/455 |
| | | 118/715 |
| 2005/0000430 A1 | 1/2005 | Jang et al. |
| 2010/0184298 A1 | 7/2010 | Dhindsa |
| 2014/0154888 A1 | 6/2014 | Stevenson et al. |
| 2014/0209027 A1 | 7/2014 | Lubomirsky et al. |
| 2014/0262031 A1 * | 9/2014 | Belostotskiy ....... H01J 37/3244 |
| | | 156/345.28 |
| 2015/0325416 A1 | 11/2015 | Kholodenko et al. |
| 2016/0005571 A1 | 1/2016 | Della Rosa et al. |

* cited by examiner

US 10,886,107 B2

EXTENDED DETACHABLE GAS DISTRIBUTION PLATE AND SHOWERHEAD INCORPORATING SAME

CROSS-REFERENCE TO RELATED APPLICATIONS

This application is a continuation of co-pending U.S. patent application Ser. No. 15/416,757, filed Jan. 26, 2017, which claims benefit of U.S. provisional patent application Ser. No. 62/297,930, filed Feb. 21, 2016. Each of the aforementioned patent applications is herein incorporated by reference in their entirety.

FIELD

Embodiments of the present disclosure generally relate to semiconductor processing equipment.

BACKGROUND

Conventional detachable showerheads utilized in semiconductor process chambers (e.g., deposition chambers, etch chambers, or the like) typically include a gas distribution plate removably coupled to a body using a metallic (e.g., aluminum) clamp. To prevent sputtering of the metallic clamp material, the clamp is coated with a dielectric (e.g., quartz). However, the inventors have observed that the coated metallic clamp reduces the size of the gas distribution plate, which acts as an electrode. In addition, the inventors have further observed that the material and location of the clamp can negatively impact etch chemistry and process results for some processes.

Therefore, the inventors have provided embodiments of an improved showerhead with a detachable gas distribution plate.

SUMMARY

Embodiments of showerheads having a detachable gas distribution plate are provided herein. In some embodiments, a showerhead for use in a semiconductor processing chamber may include a body having a first side and a second side; a gas distribution plate disposed proximate the second side of the body and having an annular channel formed in a side surface; and a clamp disposed about a peripheral edge of the gas distribution plate to removably couple the gas distribution plate to the body, wherein the clamp includes a body and a protrusion extending radially inward into the annular groove, and wherein a portion of the gas distribution plate extends over a bottom surface of the clamp.

In some embodiments a showerhead for use in a semiconductor processing chamber includes: a body having a first side, an opposing second side, and a plurality of through holes to facilitate the passage of process gases through the body; a gas distribution plate disposed proximate the second side of the body, having a plurality of gas distribution holes formed through the gas distribution plate from a body-facing side to an opposing processing volume-facing side, and an annular groove formed in a side surface of the gas distribution plate; and a clamp disposed about a peripheral edge of the gas distribution plate to removably couple the gas distribution plate to the body, wherein the clamp includes a body and a protrusion extending radially inward into the annular groove, and wherein a portion of the processing volume-facing side of the gas distribution plate extends over a predominant portion of a bottom surface of the clamp.

In some embodiments, a process chamber may include a chamber body having a substrate support disposed within an inner volume of the chamber body; and a showerhead disposed within the inner volume of the chamber body opposite the substrate support. The showerhead includes: a body having a first side and a second side; a gas distribution plate disposed proximate the second side of the body and having an annular channel formed in a side surface; and a clamp disposed about a peripheral edge of the gas distribution plate to removably couple the gas distribution plate to the body, wherein the clamp includes a body and a protrusion extending radially inward into the annular groove, and wherein a portion of the gas distribution plate extends over a bottom surface of the clamp.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the present disclosure and are therefore not to be considered limiting of the scope of the disclosure, for the disclosure may admit to other equally effective embodiments.

Figure 1:
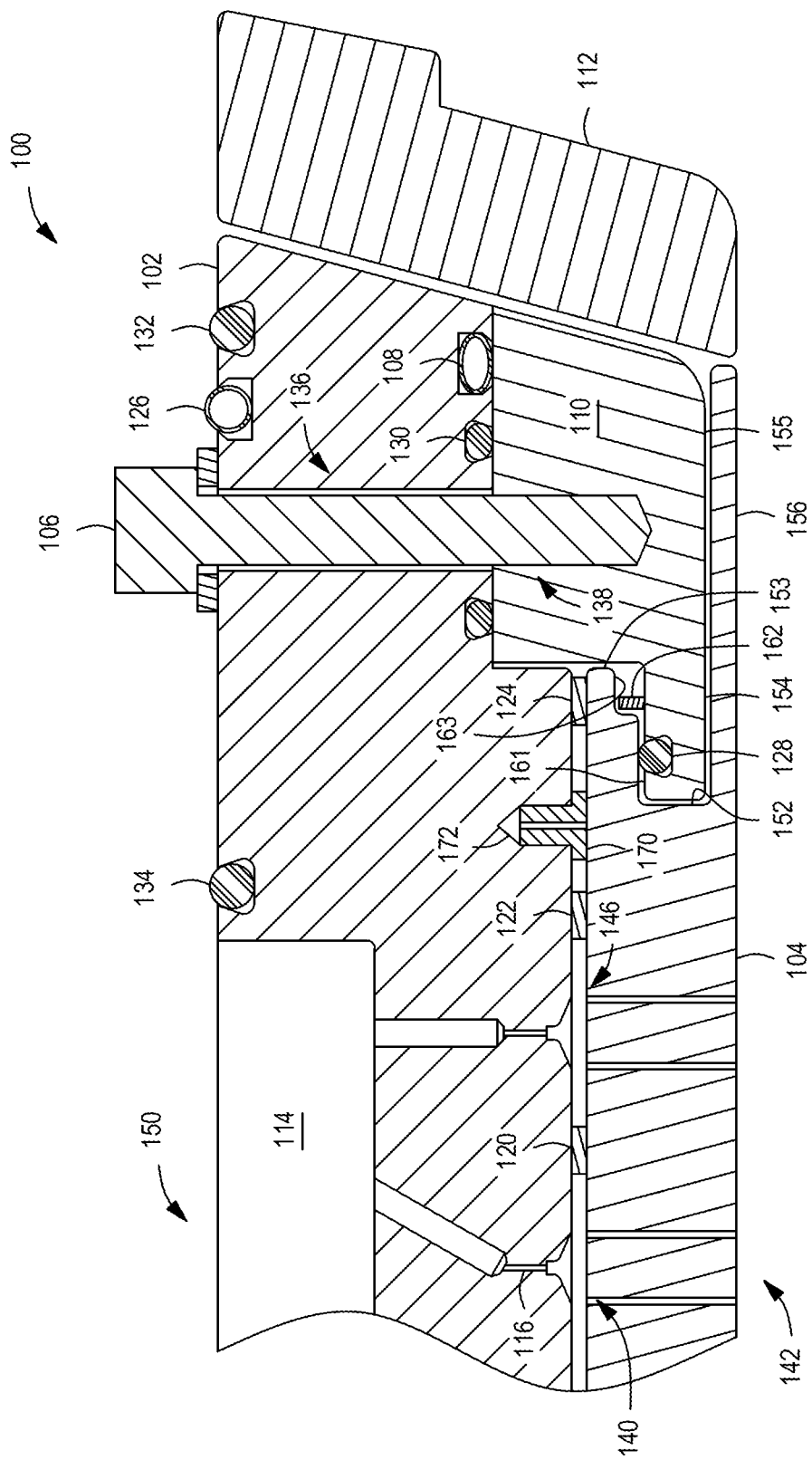
FIG. 1 depicts a partial cross-sectional side view of a showerhead with a removable gas distribution plate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of showerheads having a detachable gas distribution plate are provided herein. In at least some embodiments, the inventive showerhead may advantageously allow for the removal and replacement of the gas distribution plate, thus providing a showerhead having a longer useful life and a more cost efficient manner of replacing the gas distribution plate as compared to conventional showerheads having a permanently bonded gas distribution plate.

FIG. 1 depicts a showerhead with a gas distribution plate in accordance with some embodiments of the present disclosure. The showerhead 100 generally comprises a body 102, a gas distribution plate 104 and a clamp 110 configured to removably couple the gas distribution plate to the body 102.

The body 102 comprises a first side 150, a second side 140 and a plurality of through holes 116 formed in the body 102 extending from the first side 150 to the second side 140. The plurality of through holes 116 facilitate the passage of process gases through the body 102 to the gas distribution plate 104. In some embodiments, the through holes 116 may be counter sunk (e.g., countersink 118 shown) to reduce a residual electrical field at the through holes 116 and to facilitate a more uniform gas flow to the gas distribution plate 104. In some embodiments, a cavity 114 may be formed in first side 150 of the body 102 to facilitate more even distribution of process gases to the plurality of through holes 116. The body 102 may be fabricated from any suitable process compatible material, for example, such as aluminum. By fabricating the body 102 from a conductive material such as aluminum, the body 102 may function as an electrode to facilitate, for example, the formation of a plasma from process gases provided to the showerhead 100.

In some embodiments, one or more channels may be formed in the surfaces of the body 102 to accommodate one or more o-rings and/or RF gaskets (o-rings 130, 132, 134 and RF gaskets 108, 126 shown). When present, the o-rings 130, 132, 134 provide a seal between the body 102 and clamp 110 or surfaces of the process chamber (not shown). The o-rings 130, 132, 134 may be fabricated from any material suitable to facilitate the aforementioned seal, for example, rubber.

Figure 1A:
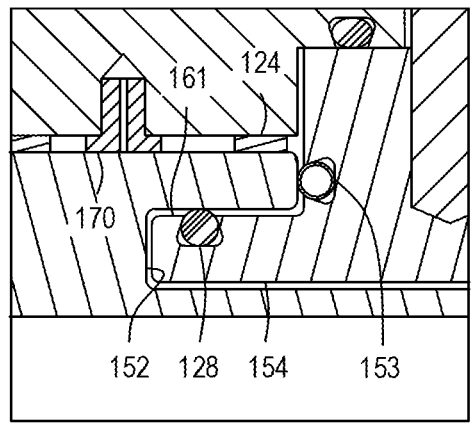
FIG. 1A depicts a partial cross-sectional side view detailing a gas distribution plate of a showerhead with a removable gas distribution plate in accordance with some embodiments of the present disclosure.

The RF gaskets 108, 126 facilitate conductivity of RF power from, for example, an RF source to the body 102 and the clamp 110. For example, RF power may be provided from an RF power supply (such as the RF power supply 248 described below) to a component coupled to the body 102 and in contact with one or more RF gaskets (e.g., RF gasket 126). The location of the o-rings and the RF gaskets are illustrative only. Additional or alternate positions of one or more of the o-rings and the RF gaskets may be used. In some embodiments, an RF gasket 109 may be provided between the clamp 110 and the gas distribution plate 104, as depicted in FIG. 1A. Positioning the RF gasket 109 along the inner diameter of the clamp 110 (above the protrusion 154) advantageously facilitates RF return and enhances the gas distribution plate 104 electrode area in the plasma. The RF gaskets 108, 109, 126 may be fabricated from any suitable conductive material, for example stainless steel.

The gas distribution plate 104 facilitates distribution of process gases provided from the body 102 to, for example, a processing volume of a process chamber via a plurality of gas distribution holes 142 formed in the gas distribution plate 104. The gas distribution holes 142 may be arranged in any manner suitable to provide a desired distribution of process gases. For example, in some embodiments, the gas distribution holes 142 may be arranged in clusters disposed about the through holes 116 of the body 102 when the gas distribution plate 104 is coupled to the body 102.

The gas distribution plate 104 includes an annular groove 152 formed in a side surface 153 of the gas distribution plate 104. The annular groove 152 is sized to accommodate a portion of the clamp 110 as discussed below. The gas distribution plate 104 also includes a lower portion 156 that extends over a bottom surface of the clamp 110 to increase the size of the exposed portion of the gas distribution plate. In some embodiments, the lower portion 156 extends over substantially the entire bottom surface of the clamp 110. The inventors have observed that the increased exposed surface area of the gas distribution plate 104 advantageously improves the electrical field because more RF power couples to a plasma formed beneath the gas distribution plate 104 due to the increased surface area. As a result, edge uniformity of a substrate being processed is advantageously improved due to the increased plasma uniformity at the edge of the substrate. In addition, the increased exposed surface area of the gas distribution plate 104 facilitates location of additional gas distribution holes 142 further radially outward, which has also been found to advantageously improve edge uniformity of a substrate being processed.

The gas distribution plate 104 may be fabricated from any material suitable to resist degradation during exposure to a plasma (e.g., a plasma formed in a process chamber during processing). For example in some embodiments, the gas distribution plate 104 may be fabricated from single crystalline silicon (Si). Single crystalline silicon is not typically used as a material for the gas distribution plate at least in part due to single crystalline silicon having a faster etch rate as compared to silicon carbide, a favored material. However, the inventors have observed that single crystalline silicon is less susceptible to surface roughness change, arcing, and micro-masking, and further provides better operability at elevated temperatures (e.g., higher than about 150 degrees Celsius) as compared to conventional materials utilized to fabricate gas distribution plates, for example, such as silicon carbide (SiC). In addition, single crystal silicon is more readily available and obtainable at a lower cost as compared to the conventional materials. In addition, in embodiments where the showerhead 100 is used in substrate processes involving silicon-containing gases, fabricating the gas distribution plate 104 from silicon reduces the instances of contamination due to degradation of the gas distribution plate 104.

The gas distribution plate 104 may have any suitable thickness sufficient to provide a desired gas distribution and suitable useful functional life. In addition, in some embodiments, the gas distribution plate 104 may have a suitable thickness sufficient to ensure continuous contact with one or more thermal gaskets (three thermal gaskets 120, 122, 124 shown) disposed between the gas distribution plate 104 and the body 102 when the gas distribution plate 104 is coupled to the body 102. For example, in some embodiments, the thickness of the gas distribution plate 104 may be selected such that an amount of bowing of the gas distribution plate 104 caused by the forces provided by the clamp 110 at the edge of the gas distribution plate 104 is less than an amount of deformation of the thermal gaskets 120, 122, 124 when compressed, thus ensuring continuous contact with the thermal gaskets 120, 122, 124 when clamped. Alternatively, or in combination, in some embodiments, the thickness of the gas distribution plate 104 may be selected to provide an aspect ratio of the gas distribution holes 142 suitable to reduce plasma penetration and improve the useful functional life of the gas distribution plate 104. For example, in embodiments where the gas distribution holes 142 have a diameter of about 0.5 mm, the gas distribution plate 104 may have a thickness of about 11.1 mm. In some embodiments, the aspect ratio of the gas distribution holes 142 is about 22:1.

The clamp 110 facilitates coupling the gas distribution plate 104 to the body 102. In some embodiments, the clamp 110 facilities such coupling via a fastener 106 provided to a through hole 136 formed in the body 102 corresponding to a threaded hole 138 formed in the clamp. The clamp 110 may be fabricated from any process compatible conductive material, for example aluminum.

Figure 1B:
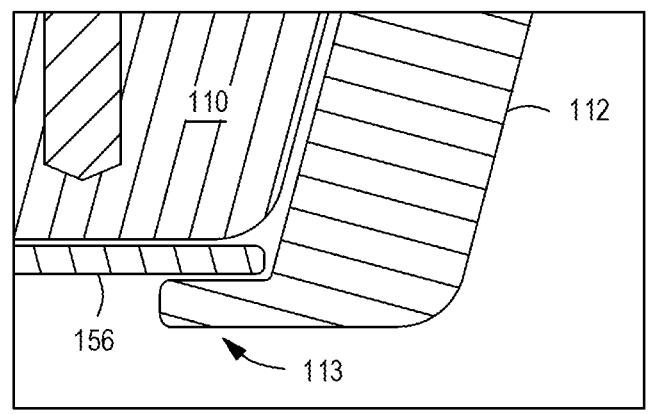
FIG. 1B depicts a partial cross-sectional side view detailing a protective ring of a showerhead with a removable gas distribution plate in accordance with some embodiments of the present disclosure.
Figure 1C:
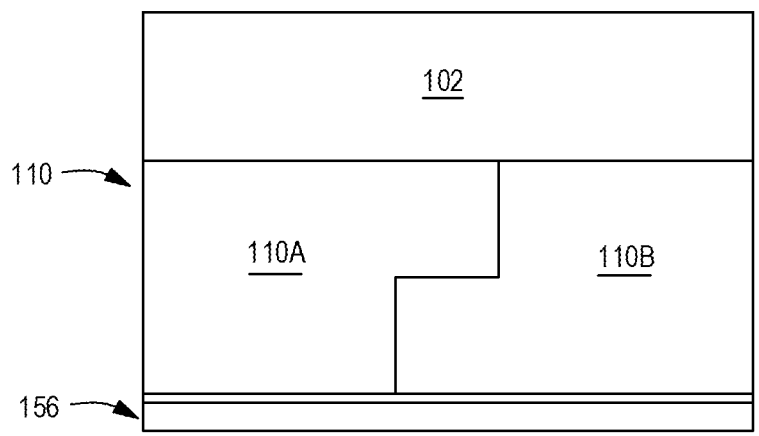
FIG. 1C depicts a partial side view detailing a clamp joint of a showerhead with a removable gas distribution plate in accordance with some embodiments of the present disclosure.

As noted above, conventional clamps which clamp the gas distribution plate on a substrate-facing surface limit the size of an exposed substrate-facing surface and must also be coated with a dielectric so that the metallic clamp material is not sputtered. As such, the inventors have developed the inventive showerhead having the gas distribution plate 104 described above. The clamp 110 is formed of two or more arcuate pieces (e.g., 110A, 110B, depicted in FIG. 1C) that form the annular structure of the clamp 110. In some embodiments, the clamp 110 is formed of two semicircular pieces. In some embodiments, and as depicted in FIG. 1C, the separate pieces of the clamp 110 may have a non-linear joint (e.g., non-linear mating edges), such as the lap joint between adjacent clamp pieces 110A and 110B depicted in FIG. 1C, that advantageously prevents a line of sight gap from one side of the clamp to the opposite side of the clamp that may undesirably allow plasma ignition in and/or through the gap.

The clamp 110 includes a body 155 and a protrusion 154 extending radially inward from the body 155. When the showerhead 100 is assembled, the protrusion 154 extends into the annular groove 152 and, thus, couples the gas distribution plate 104 to the body 102. To ensure correct alignment of the gas distribution plate 104 with the plurality of through holes 116, each piece of the two or more arcuate pieces of the clamp 110 includes one or more pins 162 extending perpendicularly to an upper surface 161 of the protrusion 154. One or more corresponding slots 163 (one shown) are formed in the gas distribution plate 104 to accommodate a corresponding pin 162. In some embodiments, to further ensure correct alignment of the gas distribution plate 104 with the plurality of through holes 116, each pin 162 may be sized differently than the other pins. In such embodiments, each slot 163 is sized to accommodate only one of the pins 162 so that the gas distribution plate 104 has one position (or orientation) in which the pins 162 fit into their corresponding slots 163.

In some embodiments, the clamp 110 may include one or more channels formed in surfaces of the clamp 110 to accommodate one or more o-rings (o-ring 128 shown). When present, the o-ring 128 provides cushioning to the gas distribution plate 104 to prevent breakage of the gas distribution plate 104 when clamped to the body 102. Providing the RF current path to the gas distribution plate 104 also shields a gap 146 between the body 102 and the gas distribution plate 104, which reduces arcing, for example, at the through holes 116 of the body 102. The o-ring 128 may be fabricated from any suitable material, for example such as the materials discussed above with respect to the o-rings 130, 132, 134. The o-ring 128 spaces the gas distribution plate 104 apart from the clamp 110.

In some embodiments, the thermal gaskets 120, 122, 124 may be disposed between the body 102 and gas distribution plate 104. When present, the thermal gaskets 120, 122, 124 may facilitate a heat exchange between the body 102 and the gas distribution plate 104, for example, to provide a more uniform thermal gradient across the gas distribution plate 104. In addition, the thermal gaskets 120, 122, 124 may provide the gap 146 between the body 102 and the gas distribution plate 104 and define separate plenums (e.g., zones) for groups of through holes 116 and corresponding gas distribution holes 142. The inventors have discovered that by minimizing the gap 146, plasma light-up between the gas distribution plate 104 and the body 102 may be prevented at high power. In some embodiments, the gap 146 may be between about 0.1 mm to about 0.5 mm to eliminate plasma light-up at a bias power level between about 10 kW to about 15 kW and source power greater than about 2,500 W.

The thermal gaskets 120, 122, 124 may be fabricated from any compressible, thermally conductive material having low out-gassing at process pressures and temperatures (e.g., vacuum conditions and temperatures at or above about 150 degrees Celsius). For example, in some embodiments, the gasket may comprise a silicon containing material. The thermal gaskets 120, 122, 124 may have any shape suitable to maintain contact between the body 102 and the gas distribution plate 104. For example, in some embodiments, the thermal gaskets 120, 122, 124 may be a plurality of concentric rings having a rectangular cross section as shown in FIG. 1. In some embodiments, the geometry of the thermal gaskets 120, 122, 124 may be optimized to accommodate for a difference in distance between the body 102 and the gas distribution plate 104 when clamped together due to the forces provided by the clamp 110 at the edge of the gas distribution plate 104 (e.g., bowing of the gas distribution plate 104).

In some embodiments, a protective ring 112 may be disposed about the showerhead to shield portions of the body 102, clamp 110 and gas distribution plate 104. The protective ring 112 may be fabricated from any suitable process compatible material, for example, quartz ($SiO_2$). Conventionally, the protective ring 112 extends over the bottom surface of the clamp to protect the clamp from being sputtered by the plasma. However, because the lower portion 156 of the inventive gas distribution plate 104 extends over the bottom surface of the clamp 110, in some embodiments, the protective ring 112 extends only up to the periphery of the lower portion 156 and does not extend over the substrate-facing surface of the gas distribution plate 104. As a result, a larger surface area of the gas distribution plate 104 is advantageously exposed to a plasma formed beneath the gas distribution plate 104, thus improving plasma uniformity, especially at an edge of a substrate being processed. Alternatively, in some embodiments, a small portion of the edge of the gas distribution plate 104 may be covered by an end portion 113 of the protective ring 112, as depicted in FIG. 1B. In such configurations, a larger surface area of the gas distribution plate 104 is still advantageously exposed to a plasma formed beneath the gas distribution plate 104 (as compared to conventional designs), thus improving plasma uniformity, especially at an edge of a substrate being processed, while imparting additional protection to the edge of the gas distribution plate 104.

In some embodiments, the showerhead 100 may include a plurality of hard stops 170 (one hard stop 170 shown in FIG. 1) disposed about a central axis of the showerhead in a corresponding plurality of holes 172 (one hole 172 shown in FIG. 1) to provide a more rigid support for spacing the gas distribution plate 104 apart from the body 102. Each hard stop 170 may include a through hole to allow gas trapped in the hole 172 to escape. The plurality of hard stops may be formed of any rigid process compatible polyamides. The plurality of hard stops 170 prevent over compression of the thermal gaskets 120, 122, 124.

Figure 2:
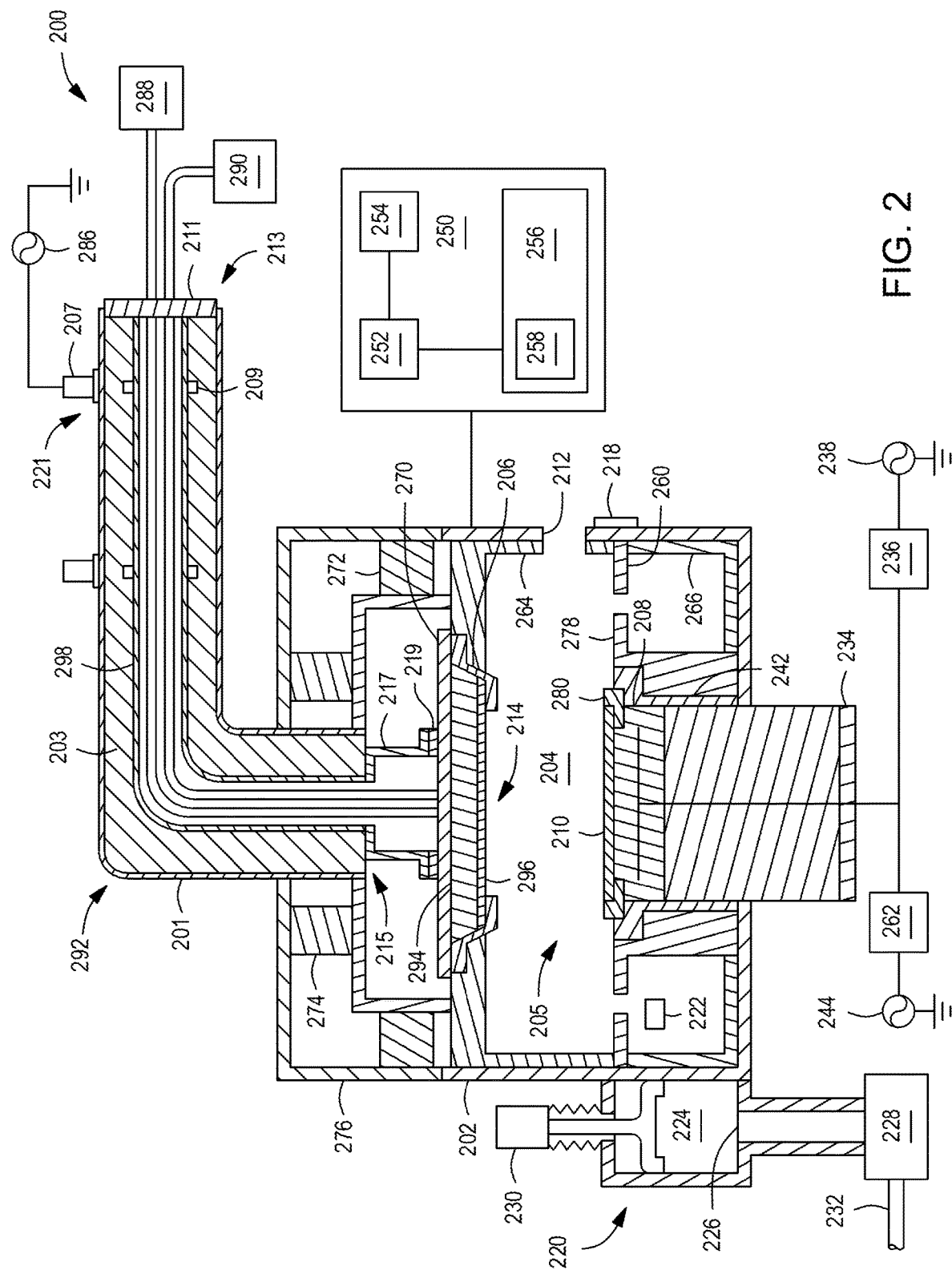
FIG. 2 depicts a process chamber suitable for use with a showerhead having a removable gas distribution plate in accordance with some embodiments of the present disclosure.

FIG. 2 depicts a schematic view of an illustrative process chamber 200 suitable for use with a showerhead in accordance with some embodiments of the present disclosure. Exemplary process chambers may include the ENABLER®, ENABLER® E5, ADVANTEDGE™, or other process chambers, available from Applied Materials, Inc. of Santa Clara, Calif. Other suitable process chambers having, or being modified to have, showerheads may similarly benefit from the present disclosure.

In some embodiments, the process chamber 200 may generally comprise a chamber body 202 having a substrate support pedestal 208 for supporting a substrate 210 thereupon disposed within an inner volume 205 of the chamber body, and an exhaust system 220 for removing excess process gases, processing by-products, or the like, from the inner volume 205 of the chamber body 202.

In some embodiments, an upper liner 264 and a lower liner 266 may cover the interior of the chamber body 202 to protect the chamber body 202 during processing. In some embodiments, the chamber body 202 has an inner volume 205 that may include a processing volume 204. The processing volume 204 may be defined, for example, between the substrate support pedestal 208 and a showerhead 214 (e.g., showerhead 100 described above) and/or nozzles provided at desired locations. In some embodiments, a gas supply 288 may provide one or more process gases to the showerhead 214 for distribution of the one or more process gases to the processing volume 204 of the chamber body 202.

In some embodiments, the substrate support pedestal 208 may include a mechanism that retains or supports the substrate 210 on the surface of the substrate support pedestal 208, such as an electrostatic chuck, a vacuum chuck, a substrate retaining clamp, or the like. Alternatively, or in combination, in some embodiments, the substrate support pedestal 208 may include mechanisms for controlling the substrate temperature (such as heating and/or cooling devices, not shown) and/or for controlling the species flux and/or ion energy proximate the substrate surface. For example, in some embodiments, the substrate support pedestal 208 may include an electrode 240 and one or more power sources (two bias power sources 238, 244) coupled to the electrode 240 via respective matching networks 236, 262. For example, the substrate support pedestal 208 may be configured as a cathode coupled to a bias power source 244 via a matching network 262. The above described bias power sources (e.g., bias power sources 238, 244) may be capable of producing up to 12,000 W at a frequency of about 2 MHz, or about 13.56 MHz, or about 60 MHz. The at least one bias power source may provide either continuous or pulsed power. In some embodiments, the bias power source alternatively may be a DC or pulsed DC source.

In some embodiments, the substrate support pedestal 208 may include a substrate support ring 280 disposed atop the substrate support pedestal 208 and configured to support at least a portion of the substrate 210 during processing. In some embodiments, one or more rings (insert ring 278 and barrier ring 242 shown) may be disposed about the substrate support pedestal 208. The one or more rings may be fabricated from any suitable process compatible material. For example, in some embodiments, the insert ring may be fabricated from silicon (Si). In some embodiments, the barrier ring 242 may be fabricated from quartz ($SiO_2$). In some embodiments, a grounded mesh 260 may be disposed about the periphery of the substrate support pedestal 208 and coupled to the chamber body 202.

The substrate 210 may enter the chamber body 202 via an opening 212 in a wall of the chamber body 202. The opening 212 may be selectively sealed via a slit valve 218, or other mechanism for selectively providing access to the interior of the chamber through the opening 212. The substrate support pedestal 208 may be coupled to a lift mechanism 234 that may control the position of the substrate support pedestal 208 between a lower position (as shown) suitable for transferring substrates into and out of the chamber via the opening 212 and a selectable upper position suitable for processing. The process position may be selected to maximize process uniformity for a particular process. When in at least one of the elevated processing positions, the substrate support pedestal 208 may be disposed above the opening 212 to provide a symmetrical processing region.

In some embodiments, a protective ring 206 (e.g., the protective ring 112 described above) may be disposed about, and covering at least a portion of, the showerhead 214, for example, such as the body 294 (e.g., body 102 described above) or the gas distribution plate 296 (e.g., the gas distribution plate 104 described above) of the showerhead 214. In some embodiments, the protective ring 206 may be supported by the upper liner 264. In some embodiments, a substrate facing surface of the protective ring 206 may be flush with or extend up to about 2 mm beyond a substrate facing surface of the gas distribution plate 296 to eliminate any line of sight between the gas distribution plate 296 and the upper liner 264, which may be grounded.

In some embodiments, the showerhead 214 may be coupled to and/or supported by, a chiller plate 284. When present, the chiller plate 284 facilitates control over a temperature of the showerhead 214 during processing. In some embodiments, the chiller plate 284 comprises a plurality of channels (not shown) formed in the chiller plate 284 to allow a temperature control fluid provided by a temperature control fluid supply (chiller) 290 to flow through the chiller plate 284 to facilitate the control over the temperature of the showerhead 214. The chiller plate 284 is coupled to the showerhead 214 via the body 294. In some embodiments, the body 294 may include a plurality of ribs to improve thermal coupling between the body 294 and the chiller plate 284.

In some embodiments, one or more coils (inner coil 274 and outer coil 272 shown) may be disposed above and/or proximate a peripheral edge of the showerhead 214. When present, the one or more coils may facilitate shaping a plasma formed within the processing volume 204 of the process chamber 200.

In some embodiments, an RF power source 286 provides RF power to the chiller plate 270 and/or the showerhead 214 via a coaxial stub 292. The coaxial stub 292 is a fixed impedance matching network having a characteristic impedance, resonance frequency, and provides an approximate impedance match between the showerhead 214 and the RF power source 286. In some embodiments, the coaxial stub 292 generally comprises an inner cylindrical conductor 298, an outer cylindrical conductor 201 and an insulator 203 filling the space between the inner cylindrical conductor 298 and the outer cylindrical conductor 201.

The inner cylindrical conductor 298 and the outer cylindrical conductor 201 may be constructive of any suitable conductive material capable of withstanding the particular process environment. For example, in some embodiments, the inner cylindrical conductor 298 and the outer cylindrical conductor 201 may be fabricated from nickel-coated aluminum. One or more taps 221 are provided at particular points along the axial length of the coaxial stub 292 for applying RF power from the RF power source 286 to the coaxial stub 292. An RF power terminal 207 and the RF return terminal 209 of the RF power source 286 are connected at the tap 221 on the coaxial stub 292 to the inner cylindrical conductor 298 and the outer cylindrical conductor 201, respectively. A terminating conductor 211 at the far end 213 of the coaxial stub 292 shorts the inner cylindrical conductor 298 and the outer cylindrical conductor 201 together, so that the coaxial stub 292 is shorted at a far end 213 of the coaxial stub 292. At the near end 215 of the coaxial stub 292, the outer cylindrical conductor 201 is connected to the chamber body 202 via an annular conductive housing or support 276, while the inner cylindrical conductor 298 is connected to the chiller plate 270 and/or showerhead 214 via a conductive cylinder 217. In some embodiments, a dielectric ring 219, is disposed between and separates the conductive cylinder 217 and the chiller plate 270.

The exhaust system 220 generally includes a pumping plenum 224 and one or more conduits that couple the pumping plenum 224 to the inner volume 205 (and generally, the processing volume 204) of the chamber body 202, for example via one or more inlets 222. A vacuum pump 228 may be coupled to the pumping plenum 224 via a pumping port 226 for pumping out the exhaust gases from the chamber body 202. The vacuum pump 228 may be fluidly coupled to an exhaust outlet 232 for routing the exhaust as needed to appropriate exhaust handling equipment. A valve 230 (such as a gate valve, or the like) may be disposed in the pumping plenum 224 to facilitate control of the flow rate of the exhaust gases in combination with the operation of the vacuum pump 228. Although a z-motion gate valve is shown, any suitable, process compatible valve for controlling the flow of the exhaust may be utilized.

To facilitate control of the process chamber 200 as described above, the controller 250 may be any form of general-purpose computer processor that can be used in an industrial setting for controlling various chambers and sub-processors. The memory, or computer-readable medium, 256 of the CPU 252 may be one or more of readily available memory such as random access memory (RAM), read only memory (ROM), floppy disk, hard disk, or any other form of digital storage, local or remote. The support circuits 254 are coupled to the CPU 252 for supporting the processor in a conventional manner. These circuits include cache, power supplies, clock circuits, input/output circuitry and subsystems, and the like. One or more methods and/or processes may generally be stored in the memory 256 as a software routine 258 that, when executed by the CPU 252, causes the process chamber 200 to perform the processes methods and/or processes.

Thus, embodiments of a showerhead having a detachable gas distribution plate have been provided herein. Embodiments of the inventive showerhead may advantageously provide a longer useful life and a more cost efficient manner of replacing the gas distribution plate, as well as improved processing results, as compared to conventional showerheads.

While the foregoing is directed to embodiments of the present disclosure, other and further embodiments of the disclosure may be devised without departing from the basic scope thereof.

The invention claimed is:

1. A gas distribution plate for use in a semiconductor processing chamber, comprising:
a plate having an upper portion having a first side and a lower portion having an opposing processing volume-facing side, wherein the lower portion extends radially outward beyond the upper portion;
an annular groove formed in a side surface of the gas distribution plate between the upper portion and the lower portion, wherein an upper surface of the annular groove includes a step; and
a plurality of gas distribution holes formed through the plate from the first side to the processing volume-facing side, and wherein the upper surface of the annular groove is opposite and parallel to a lower surface of the annular groove.

2. The gas distribution plate of claim 1, wherein the plate is fabricated from single crystalline silicon (Si).

3. The gas distribution plate of claim 1, further comprising one or more slots formed in the plate to accommodate one or more corresponding pins.

4. The gas distribution plate of claim 3, wherein each of the one or more slots are sized differently.

5. The gas distribution plate of claim 1, wherein a thickness of the lower portion is less than a thickness of the upper portion.

6. The gas distribution plate of claim 1, wherein a width of the annular groove is greater than a thickness of the lower portion.

7. The gas distribution plate of claim 1, wherein a bottom of the annular groove is closer to a nearest gas distribution hole of the plurality of gas distribution holes than to an outer sidewall of the lower portion.

8. The gas distribution plate of claim 1, wherein the gas distribution holes are arranged in clusters.

9. A showerhead for use in a semiconductor processing chamber, comprising:
a gas distribution plate having an upper portion and a lower portion, wherein the lower portion defines an outermost diameter of the gas distribution plate; and
an annular groove formed in a side surface of the gas distribution plate between the upper portion and the lower portion, wherein the upper portion and the lower portion extend parallel to each other radially outward from an inner surface of the annular groove, and wherein an upper surface of the annular groove and a lower surface of the annular groove extend parallel to each other radially outward from the inner surface.

10. The showerhead of claim 9, wherein the gas distribution plate is fabricated from single crystalline silicon (Si).

11. The showerhead of claim 9, wherein a plurality of gas distribution holes are formed through the gas distribution plate.

12. The showerhead of claim 11, wherein the plurality of gas distribution holes are arranged in clusters within concentric rings.

13. The showerhead of claim 9, further comprising:
a body disposed proximate the upper portion of the gas distribution plate; and
a clamp disposed about a peripheral edge of the gas distribution plate to clamp the gas distribution plate to the body, wherein the clamp includes a protrusion extending radially inward into the annular groove, and wherein a portion of the gas distribution plate extends over a bottom surface of the clamp.

14. The showerhead of claim 13, wherein the clamp comprises two or more arcuate pieces or two semicircular pieces.

15. The showerhead of claim 13, wherein the portion of the gas distribution plate substantially completely covers the bottom surface of the clamp.

16. The showerhead of claim 13, further comprising an RF gasket disposed between the clamp and the gas distribution plate.

17. The showerhead of claim 13, wherein the body includes a plurality of through holes formed through the body.

18. The showerhead of claim 13, further comprising a thermal gasket, wherein the thermal gasket comprises a plurality of concentric rings disposed between the body and the gas distribution plate.

19. A process chamber, comprising:
   a chamber body having a substrate support disposed within an inner volume of the chamber body; and
   a showerhead disposed within the inner volume of the chamber body opposite the substrate support, wherein the showerhead is as described in claim 9.

\* \* \* \* \*